United States Patent [19]

Misumi

[11] Patent Number: 4,998,968
[45] Date of Patent: Mar. 12, 1991

[54] PLASMA CVD APPARATUS

[75] Inventor: Teruo Misumi, Kawasaki, Japan

[73] Assignee: Canon Kabushiki Kaisha, Tokyo, Japan

[21] Appl. No.: 397,353

[22] Filed: Aug. 23, 1989

Related U.S. Application Data

[63] Continuation of Ser. No. 332,429, Mar. 30, 1989, abandoned, which is a continuation of Ser. No. 140,957, Jan. 4, 1988, abandoned, which is a continuation of Ser. No. 686,151, Dec. 26, 1984, abandoned.

[30] Foreign Application Priority Data

Jan. 24, 1984 [JP] Japan .................................. 1-9518

[51] Int. Cl.⁵ .................................... C23C 16/50
[52] U.S. Cl. .................................... 118/723; 427/39
[58] Field of Search ............................ 118/723; 427/39

[56] References Cited

U.S. PATENT DOCUMENTS

| | | | |
|---|---|---|---|
| 4,223,048 | 9/1980 | Engle | 427/39 |
| 4,379,943 | 4/1983 | Yang | 427/39 |
| 4,452,686 | 6/1984 | Axenov et al. | 118/723 X |
| 4,452,828 | 6/1984 | Namba et al. | 427/39 |
| 4,462,333 | 7/1984 | Nath | 118/723 |
| 4,576,830 | 3/1986 | Kiss | 118/723 |
| 4,616,597 | 10/1986 | Kaganowicz | 118/723 |

OTHER PUBLICATIONS

Maissel et al., Handbook of Thin Film Technology, ©1970, McGraw-Hill, N.Y. pp. 4–32 to 4–35.
Vossen et al., Thin Film Processes, Academic Press, N.Y. ©1978, pp. 27–28.

Primary Examiner—Richard Bueker
Attorney, Agent, or Firm—Fitzpatrick, Cella, Harper & Scinto

[57] ABSTRACT

A plasma CVD apparatus for forming a deposition film on a base by causing a discharge in a space between the base and an electrode has an auxiliary member removably arranged in electrical contact to the electrode on a face of the electrode which contributes to the discharge. The auxiliary member thus acts as the electrode.

40 Claims, 3 Drawing Sheets

PLASMA CVD APPARATUS

This application is a continuation of application Ser. No. 332,429 filed Mar. 30, 1989, now abandoned, which was a continuation of application Ser. No. 140,957 filed Jan. 4, 1988, now abandoned, which was a continuation of application Ser. No. 686,151 filed Dec. 26, 1984, now abandoned.

BACKGROUND OF THE INVENTION

1. Field of the Invention

The present invention relates to a plasma CVD apparatus for forming a deposition film on a substrate, and more particularly to a plasma CVD apparatus used for forming an electrophotographic photoconductor by depositing an amorphous silicon film on a cylindrical substrate surface, and more particularly to a plasma CVD apparatus suitable for mass production.

2. Description of the Prior Art

An example of a cylindrical plasma CVD apparatus which is a typical example of prior art plasma CVD apparatus is explained.

FIG. 1 shows a schematic longitudinal sectional view of typical one of the prior art cylindrical plasma CVD apparatus. Numeral 1 denotes a cylindrical cathode electrode of a vacuum chamber, numeral 2 denotes a cylindrical base of an anode electrode which is a counterelectrode coaxially arranged to rotate around a center axis of the vacuum chamber, numeral 3 denotes a wall of the vacuum chamber, numeral 4 denotes a doughnut shaped insulation for insulating the wall from the cathode electrode, numeral 5 denotes an RF power supply, numeral 6 denotes a source gas supply pipe, arrow 7 indicates an exhaust direction, numeral 8 denotes a heater, numeral 9 denotes a motor for rotating the cylindrical base, numeral 10 denotes ground, numeral 11 denotes a vacuum gauge, numeral 12 denotes a main valve, numeral 13 denotes a leak valve, numeral 14 denotes a shield plate and numeral 15 denotes a mass flow controller.

An operation of the plasma CVD apparatus is briefly explained.

A cylindrical substrate 1 is set in the vacuum chamber and a chamber is evacuated by the vacuum system. The base 2 is heated by the heater 8 and rotated by the motor 9 to obtain a uniform temperature distribution on the base. The heater is fixed during this period. When the base temperature reaches a predetermined value, source gas is supplied from the gas supply pipe 6 to the vacuum chamber An RF voltage is applied to the cathode electrode 1 by the RF power supply 5 of 13.56 MHz, for example, while the gas is stably fed into the vacuum chamber so that a glow discharge occurs between the cathode electrode 1 and the grounded base 2 Thus, gas molecules are radical-reacted by bombardment of electrons emitted from the cathode electrode 1 to the gas molecules and deposited on the base so that a deposition film, for example, an amorphous silicon film is formed on the base 2.

By the nature of the construction of this prior art plasma CVD apparatus, the deposition film is also deposited elsewhere than on the desired area, for example, on an inner wall of the vacuum chamber wall 3 or an inner wall of the cylindrical cathode electrode 1 of the vacuum chamber. The deposition film deposited on the other than desired base area is easily removed from the surface it is on and hence is a cause of foreign material in the next deposition film forming cycle. Where the deposition films are successively formed on a number of bases exchangeably mounted, it is necessary to remove the deposition film deposited elsewhere than on the other than base area each time the base is exchanged in order to maintain a high quality of deposition film. Accordingly, continuous production is not attained by merely exchanging the base, and mass productivity is not improved. Many radicals are deposited on the surface of the electrode which faces the base. This deposition film must be removed in each film forming cycle in order to prevent the degradation of the deposition film formed on the base.

SUMMARY OF THE INVENTION

It is an object of the present invention to provide a novel plasma CVD apparatus which resolves the disadvantages of the prior art plasma CVD apparatus and permits continuous production at a low cost.

It is another object of the present invention to provide a plasma CVD apparatus which causes a discharge in a space between a base and an electrode to form a deposition film on the base, in which an auxiliary member which electrically contacts to the electrode is removably arranged on the surface of the electrode which contributes to the discharge so that the auxiliary member acts as the electrode.

In accordance with the present invention, by arranging the easy-to-exchange auxiliary member, the removal of dust which was heretofore required for each exchange of the base can be carried out by the simple operation of exchanging the auxiliary member. Accordingly, high quality and low cost products can be continuously manufactured.

DETAILED DESCRIPTION OF THE PREFERRED EMBODIMENTS

The auxiliary member used in the present embodiment may be made of a conductive material such as stainless steel or aluminum, and preferably it is an inexpensive material because it is disposable. Since high strength is not required because of its structure, the thickness of the auxiliary material is preferably no more than 2 mm from the standpoints of easiness of exchange and low cost.

The preferred embodiments of the present invention are now explained with reference to the drawings.

In the following embodiments, the base on which the deposition film is formed is an electrophotographing cylindrical base (drum) although the present invention can be applied to deposit an amorphous photoconductive film or an operational device amorphous semiconductor film on rectangular bases arranged in a polygon form on a cylindrical counterelectrode, or it may be applied to deposit a super-hard film on a surface of a tool such as dies or cutting tools which are subject to abrasion. The discharge in the present invention may be a glow discharge or arc discharge although, the detailed description being made is with reference to the glow discharge.

Figure 1:
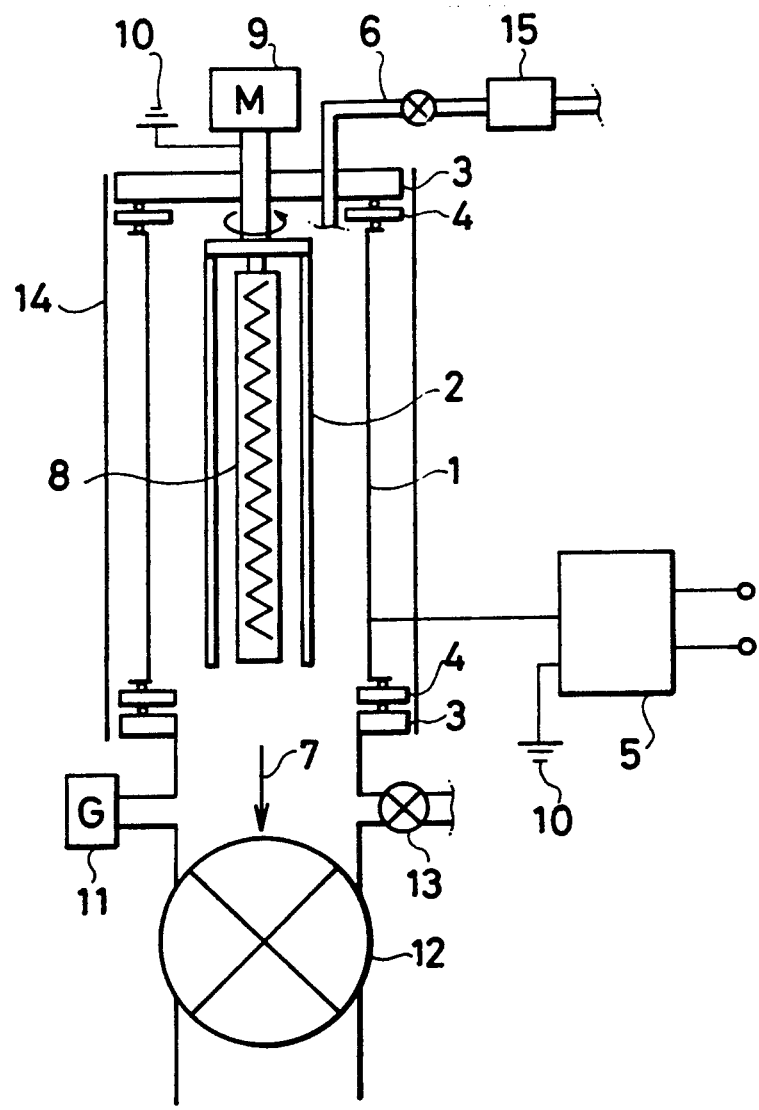
FIG. 1 shows a prior art cylindrical plasma CVD apparatus.
Figure 2:
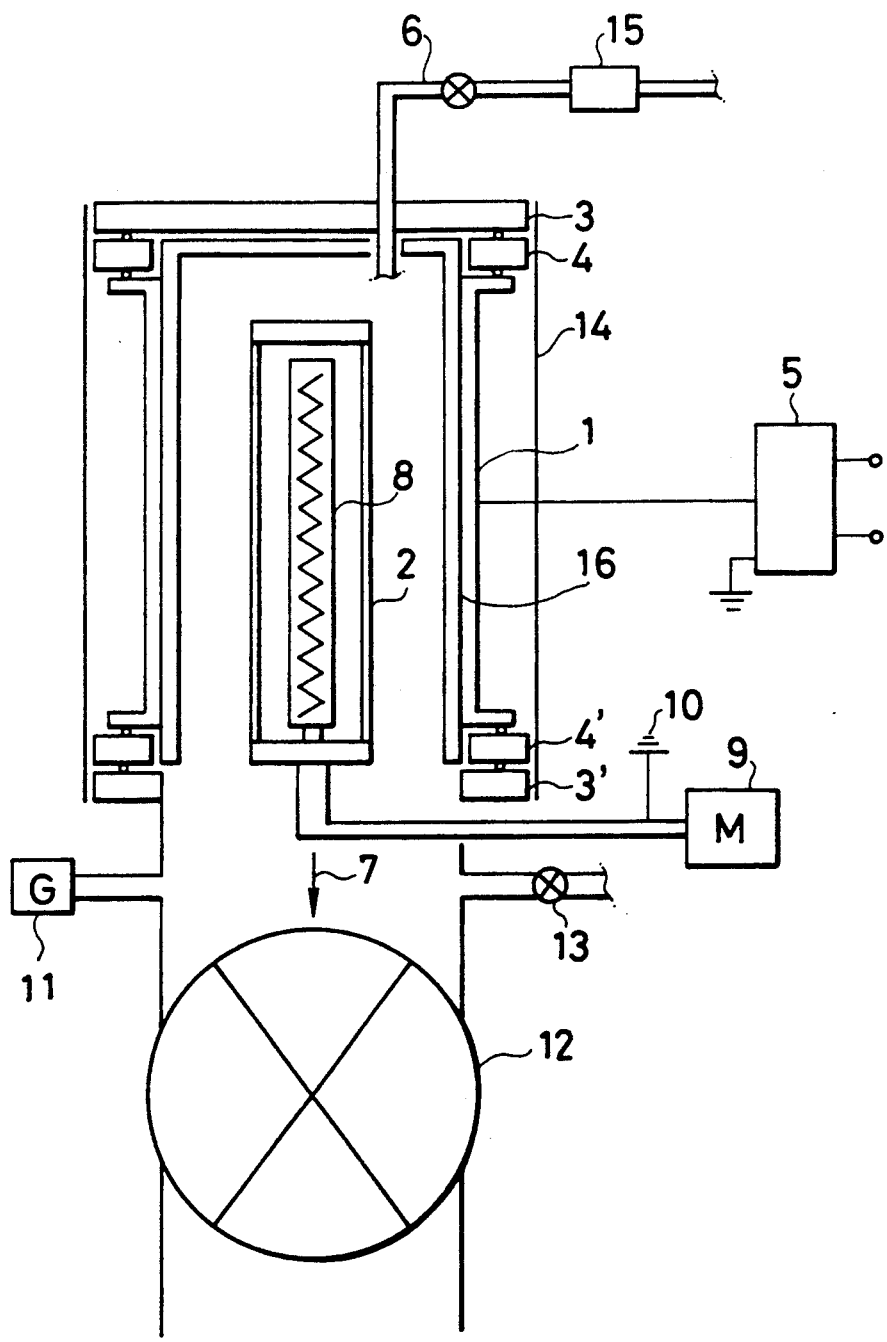
FIGS. 2 to 5 show embodiments of a plasma CVD apparatus of the present invention.

FIG. 2 shows a first embodiment of the plasma CVD apparatus of the present invention. It shows a longitudinal sectional view. The elements like those shown in FIG. 1 are designated by like numerals. Numeral 1 denotes a cylindrical cathode electrode of a vacuum chamber, numeral 2 denotes a cylindrical base of an anode electrode which is a counterelectrode and coaxially arranged to rotate around a center axis of the vacuum chamber, numerals 3 and 3' denote walls of the vacuum chamber, numerals 4 and 4' denote doughnut shape insulators for insulating the walls from the cathode electrode, numeral 5 denotes an RF power supply, numeral 6 denotes a source gas supply pipe, an arrow 7 indicate an exhaust direction, numeral 8 denotes a heater, numeral 9 denotes a motor for rotating the cylindrical base, numeral 10 denotes ground, numeral 11 denotes a vacuum gauge, numeral 12 denotes a main valve, numeral 13 denotes a leak valve, numeral 14 denotes a shield plate, numeral 15 denotes a mass flow controller, and numeral 16 denotes an auxiliary member arranged to contact to the cathode electrode 1.

The auxiliary member 16 contacts to the cathode electrode 1 to act as the cathode electrode. In the present embodiment, the auxiliary member 16 is a stainless steel cylinder having a plate thickness of 1 mm and an outer diameter equal to an inner diameter of the cathode electrode 1 so that it contacts the entire area of the inner surface (facing the base 2) of the cathode electrode 1. In the present embodiment, since the anode electrode 2 serves as the base, it is sufficient to arrange the auxiliary member 16 on the surface of the cathode electrode 1 which contributes to the discharge (that is, the surface of the cathode electrode 1 which faces the anode electrode 2) but in the present embodiment, the auxiliary member 16 is shaped to cover the vacuum chamber wall 3 as shown in FIG. 2 in order to prevent undesired deposition film from being formed on the vacuum chamber wall 3. In order to facilitate the mounting and removal of the auxiliary member 16, the motor for rotating the base 2 and performing the fixation operation of the base 2 is arranged on the surface of the base 2 which is on the opposite side to an inlet/outout port of the vacuum chamber (in the present embodiment, the surface facing the vacuum chamber wall 3). The auxiliary member 16 can be removed by hunging it on the vacuum chamber wall 3.

In the present embodiment, the auxiliary member 16 contacts the cathode electrode 1 over the entire area thereof. However, it is not always necessary to have the auxiliary member 16 contact the entire area of the cathode electrode 1 but it may contact only a portion of the cathode electrode 1 to impart the electrode function to the auxiliary member 16. For example, when the auxiliary member 16 is a cylinder having an outer diameter smaller than the inner diameter of the cathode electrode 1, the auxiliary member 16 may contact to the cathode electrode 1 by forming a projection large enough to allow mounting of the auxiliary member 16, on the surface of the cathode electrode 1 facing the exhaust port (near the insulator 4' in FIG. 2). In this alternative, the removal and mounting of the auxiliary member 16 ar facilitated.

The auxiliary member 16 may be mounted and removed by arranging a conductive ring between the auxiliary member 16 and the cathode electrode 1 or other methods for contacting the auxiliary member 16 with the cathode electrode 1, in addition to the hung method and projection method described above.

The operations of the respective elements are now sequentially explained.

After the cylindrical base 2 has been set in the vacuum chamber, the auxiliary member 16 is set. Then the chamber is evacuated by the vacuum system 7. The vacuum system 7 usually uses a rotary pump, a mechanical booster pump, a diffusion pump or a combination thereof in view of a compromise between the required vacuum and productivity in the process. Simultaneously with the evacuation of the chamber, the base 2 is heated by the heater 8 and rotated by a rotary shaft coupled to the motor 9 for a period of from several seconds to several tens of seconds to assure a uniform temperature distribution of the base. The heater is fixed during this period. When the base temperature reaches a predetermined temperature, source gas is fed into the vacuum chamber from the gas supply pipe 6. An RF voltage is applied to the cathode electrode 1 by the RF power supply 5 while the gas is stably fed into the vacuum chamber so that a glow discharge occurs between the cathode electrode 1 and the grounded base 2 which also serves as the anode electrode. Gas molecules are radical-reacted by bombardment of electrons emitted from the auxiliary member 16 which serves as the cathode electrode, to the gas molecules, and they are deposited on the base to form the deposition film.

After the formation of the film, the auxiliary member 16 and the base 1 are exchanged and the above operation is repeated so that the desired deposition films are continuously formed on the desired bases.

In the above embodiment, the electrode serves as a portion of the chamber wall. In another embodiment of the present invention, the electrode is arranged in the vacuum chamber, as shown in FIGS. 3 to 5.

Figure 3A:
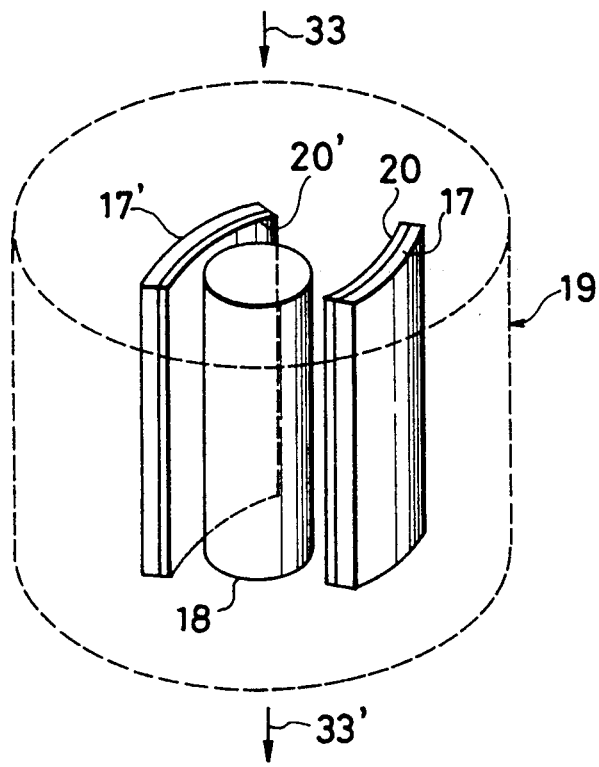
Figure 3B:
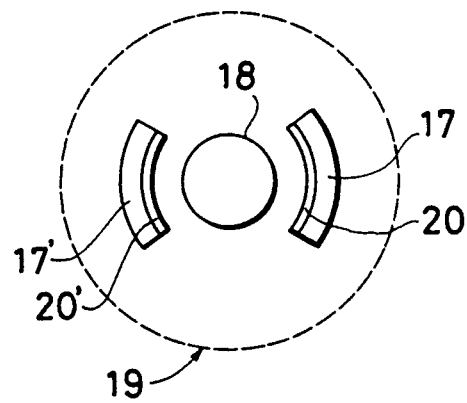

FIG. 3 shows a second embodiment of the plasma CVD apparatus of the present invention. FIG. 3A shows a perspective view and FIG. 3B shows a view looking in the direction of introduction of the source gas shown in FIG. 3A. In the present embodiment, a cylindrical base 18 which serves as an anode is arranged between two semi-cylindrical cathode electrodes 17 and 17' in a vacuum chamber 19 (which is shown by broken lines to illustrate the electrodes). Numerals 20 and 20' denote auxiliary members which are arranged in contact with the surfaces of the cathode electrodes 17 and 17' facing the anode electrode 18 because the anode electrode 18 serves as the base. The auxiliary members 20 and 20' are fixed to the electrodes by removable fixing means such as bolts.

In the present embodiment, the auxiliary members 20 and 20' are arranged only on the surfaces of the cathode electrodes 17 and 17' which face the anode electrode 18. Alternatively, the auxiliary members ma be removably arranged by the fixing means such as bolts on the rear surfaces of the cathode electrodes 17 and 17' (which are opposite to the anode electrode 18) or side surfaces (which are other than the above two surfaces). The auxiliary members may be removably arranged on the wall of the vacuum chamber which faces the electrodes. The auxiliary members arranged on the surfaces other than the surfaces of the electrodes which contribute to the discharge ma be conductive material or insulative material such as glass or vinyl chloride. While the vacuum chamber 19 is cylindrical as in the present embodiment, it may be of any desired shape, such as a box shape, because the cathode electrode 18 is arranged in the vacuum chamber 19. In accordance with the arrangement of the electrodes of the present embodiment, the auxiliary members may be moved by laterally sliding them without lifting the base.

Figure 4:
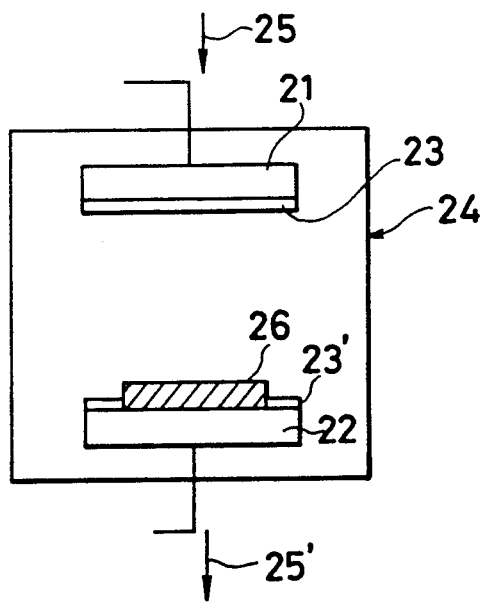
Figure 5:
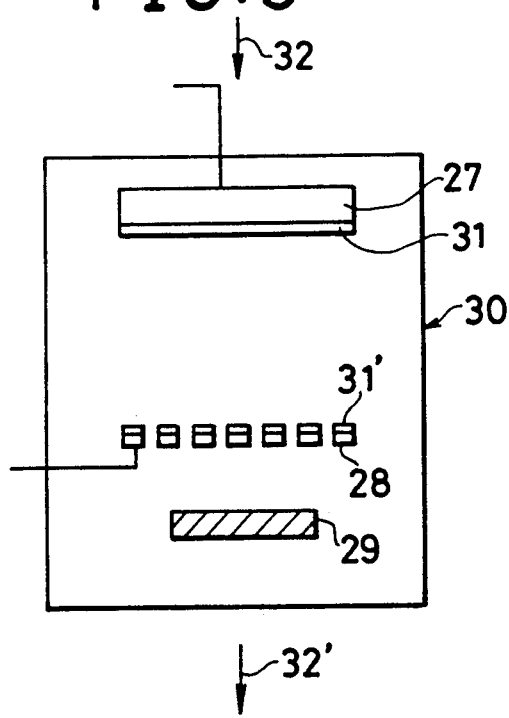

FIG. 4 shows a third embodiment of the plasma CVD apparatus of the present invention and it shows a longitudinal sectional view. The electrodes in the present embodiment are parallel plates. Numeral 21 denotes a cathode electrode and numeral 22 denotes an anode electrode. A plate shaped base 26 is arranged on the anode plate 22. Numerals 23 and 23' denote auxiliary members.

In the present embodiment, the auxiliary members 23 and 23' are arranged on the surfaces of the electrodes which contribute to the discharge, that is, on the surfaces facing the cathode electrode 21 and the anode electrode 22. Since the base 26 is arranged on the anode electrode 22, the auxiliary member 23' is partially taken away. As in the embodiment of FIG. 3, the auxiliary members may be arranged in other areas.

FIG. 5 shows a fourth embodiment of the plasma CVD apparatus of the present invention, and it shows a longitudinal sectional view. In the present embodiment, a cathode electrode 27 is of disk shape and an anode electrode 28 is a mesh of the same shape. A base 29 is disposed outside of a discharge space established by those electrodes. Radicals formed by the discharge between the electrode pass through the mesh of the anode electrode 28 and are deposited on the base 29. Numerals 31 and 31' denote auxiliary members which are of the same shape as the shape of the facing areas of the opposing electrodes. As in the embodiment of FIG. 3, the auxiliary members may be arranged in other areas.

In the plasma CVD apparatus shown in FIGS. 2 to 5, the source gas was introduced into the plasma CVD apparatus, the temperature of the base (node of aluminum) was maintained at 100° C.–350° C. and an RF voltage was applied to the cathode electrode by an RF power supply of 13.56 MHz to form films. The films were continuously formed on the bases by merely exchanging the bases and the auxiliary members. In any case, satisfactory glow discharge was maintained and uniform electrophotographing photoconductors were formed at a low cost and with a high yield. The source gases used were silane ($SiH_4$, $Si_2H_6$, $Si_3H_8$, $Si_4H_4$) as amorphous silicon film forming material, $H_2$ and rare gas as base gas, $SiF_4$ as fluorine introducing gas, $B_2H_6$, $PH_3$, $AsH_3$ as n-type controlling gas, $N_2$, $NH_3$ as nitrogen doping gas, $N_2O$, NO as oxygen doping gas, hydrocarbon such as $CH_4$, $C_2H_4$ as carbon doping material and other gases known as being doped by the plasma CVD, mixed in predetermined proportions by a mass flow controller.

As described hereinabove, in accordance with the plasma CVD apparatus of the present invention, contaminants may be deposited on the auxiliary member, which is then exchanged with a new auxiliary member each time the base is exchanged. Therefore, the cleaning of the contaminants required in the prior art plasma CVD apparatus is not necessary and the degradation of the film due to the dust caused by the remaining dust or the deposition of the dust on the base is prevented. Accordingly, the products having stabilized quality can be continuously manufactured at a low cost.

What is claimed is:

1. A plasma CVD apparatus having a vacuum chamber wall for forming a deposition film on a base, comprising:
    an electrode;
    means for causing a discharge in a space between the base and said electrode; and
    a non-consumable auxiliary member removably disposed on a surface of said electrode between the base and said electrode, said auxiliary member substantially covering said electrode and being in electrical contact with said electrode to act as said electrode, wherein said auxiliary member covers the vacuum chamber wall of the CVD plasma apparatus and contributes to said discharge.

2. A plasma CVD apparatus according to claim 1 wherein said auxiliary member has a thickness no larger than 2 mm.

3. A plasma CVD apparatus according to claim 1 wherein said auxiliary member is in total contact with said electrode.

4. A plasma CVD apparatus according to claim 1 wherein said auxiliary member is in contact with the entire area of said electrode contributing to the discharge.

5. A plasma CVD apparatus according to claim 1 wherein said auxiliary member is in contact with a portion of the surface of said electrode and contributing to the discharge.

6. A plasma CVD apparatus according to claim 1, wherein the configuration of said auxiliary member is mesh-shaped.

7. A plasma CVD apparatus according to claim 1, wherein the configuration of said auxiliary member is cylindrical.

8. A plasma CVD apparatus according to claim 1, wherein said electrode also serves as said vacuum chamber wall.

9. A plasma CVD apparatus according to claim 1, wherein said electrode and said vacuum chamber wall are provided separately.

10. A plasma CVD apparatus according to claim 1, wherein said non-consumable auxiliary member is made of an electrically conductive material.

11. A plasma CVD apparatus according to claim 1, wherein said conductive material is stainless steel.

12. A plasma CVD apparatus with a vacuum chamber wall for depositing a film on a removable base member, comprising:
    support means for supporting a removable base member at a deposition site;
    electrode means, spaced from said deposition site, and having an electrode surface, for creating a discharge in a gas located in the space between the removable base member and said electrode means upon the application of a potential between said electrode means and the base member, the discharge causing the deposition of a film on the base member; and
    removable shield means for shielding said electrode surface during the discharge, said shield means substantially covering said electrode surface so as to prevent the deposition of film on said electrode surface, said shield means being removable and in electrical contact with said electrode means to a ct as said electrode surface to thereby contribute to the creating of the discharge upon the application of the potential, and wherein said shield means covers the vacuum chamber wall of the plasma CVD apparatus.

13. A plasma CVD apparatus according to claim 12 wherein said removable shield means is in total contact with said electrode surface.

14. A plasma CVD apparatus according to claim 12 wherein said removable shield means is in contact with the entire area of said electrode surface contributing to the discharge.

15. A plasma CVD apparatus according to claim 12 wherein said removable shield means is in contact with a portion of the surface of said electrode surface and contributes to the discharge.

16. A plasma CVD apparatus according to claim 12, wherein the configuration of said removable shield means is mesh-shaped.

17. A plasma CVD apparatus according to claim 12 wherein the configuration of said removable shield means is cylindrical.

18. A plasma CVD apparatus according to claim 12 wherein said removable shield means is made of an electrically conductive material.

19. A plasma CVD apparatus according to claim 12 wherein said conductive material is stainless steel.

20. A plasma CVD apparatus according to claim 12, wherein said removable shield means has a thickness no larger than 2 mm.

21. A plasma CVD apparatus according to claim 12, wherein said electrode means also serves as said vacuum chamber wall.

22. A plasma CVD apparatus according to claim 12, wherein said electrode means and said vacuum chamber wall are provided separately.

23. A plasma CVD apparatus having a vacuum chamber wall for forming a deposition film on a base, including:
   means for supporting the base and causing it to rotate;
   an electrode;
   means or causing a discharge in a space between the base and said electrode; and
   a non-consumable auxiliary member removably disposed on a surface of said electrode between the base and said electrode, said auxiliary member substantially covering said electrode and being in electrical contact with said electrode to act as said electrode, wherein said auxiliary member contributes 24. A plasma CVD apparatus according to claim 23, wherein said supporting means supports a cylindrical base.

25. A plasma CVD apparatus according to claim 23, wherein said non-consumable auxiliary member is made of an electrically conductive material.

26. A plasma CVD apparatus according to claim 25, wherein said supporting means supports a cylindrical base.

27. A plasma CVD apparatus according to claim 23, wherein said conductive material is stainless steel.

28. A plasma CVD apparatus according to claim 23, wherein said electrode also serves as said vacuum chamber wall.

29. A plasma CVD apparatus according to claim 23, wherein said electrode and said vacuum chamber wall are provided separately.

30. A plasma CVD apparatus with a vacuum chamber wall for depositing a film on a removable base member, including:
   support means for supporting a removable base member at a deposition site and causing it to rotate;
   electrode means, spaced from said deposition site, and having an electrode surface, for creating a discharge in a gas located in the space between the removable base member and said electrode means upon the application of a potential between said electrode means and the base member, the discharge causing the deposition of a film on the base member; and
   removable shield means for shielding said electrode surface during the discharge, said shield means substantially covering said electrode surface so as to prevent the deposition of film on said electrode surface, said shield means being removable and in electrical contact with said electrode means to act as said electrode surface to thereby contribute to the creation of the discharge upon the application of the potential.

31. A plasma CVD apparatus according to claim 30, wherein said electrode means and said vacuum chamber wall are provided separately.

32. A plasma CVD apparatus according to claim 30, wherein said removable shield means has a thickness no larger than 2 mm.

33. A plasma CVD apparatus according to claim 30, wherein said removable shield means is in total contact with said electrode surface.

34. A plasma CVD apparatus according to claim 30, wherein said removable shield means is in contact with the entire area of said electrode surface contributing to the discharge.

35. A plasma CVD apparatus according to claim 30, wherein said removable shield means is in contact with a portion of the surface of said electrode surface and contributes to the discharge.

36. A plasma CVD apparatus according to claim 30, wherein the configuration of said removable shield means is mesh-shaped.

37. A plasma CVD apparatus according to claim 30, wherein the configuration of said removable shield means is cylindrical.

38. A plasma CVD apparatus according to claim 30, wherein said removable shield means is made of an electrically conductive material.

39. A plasma CVD apparatus according to claim 30, wherein said conductive material is stainless steel.

40. A plasma CVD apparatus according to claim 30, wherein said electrode means also serves as said vacuum chamber wall.

* * * * *

UNITED STATES PATENT AND TRADEMARK OFFICE
CERTIFICATE OF CORRECTION

PATENT NO. : 4,998,968

DATED : March 12, 1991

INVENTOR(S) : Teruo Misumi, et al.

It is certified that error appears in the above-identified patent and that said Letters Patent is hereby corrected as shown below:

Title page:

[30] FOREIGN APPLICATION PRIORITY DATA:

"Jan. 24, 1984 [JP] Japan.... 1-9518" should read --Jan. 24, 1984 [JP] Japan.... 59-9518--.

COLUMN 1:

Line 43, "substrate 1" should read --substrate--.

COLUMN 2:

Line 3, "other than" should be deleted.

Line 23, "to" should be deleted.

COLUMN 3:

Line 19, "to" should be deleted.

Line 39, "inlet/outout" should read --inlet/outlet--.

Line 42, "by hunging it on" should read --with--.

Line 54, "to" should be deleted.

COLUMN 5:

Line 33, "(node" should read --(mode--.

UNITED STATES PATENT AND TRADEMARK OFFICE
CERTIFICATE OF CORRECTION

PATENT NO. : 4,998,968  
DATED : March 12, 1991  
INVENTOR(S) : Teruo Misumi, et al.

Page 2 of 2

It is certified that error appears in the above-identified patent and that said Letters Patent is hereby corrected as shown below:

Line 45, "n-type" should read --p-type or n-type--.

COLUMN 6:

Line 58, "a ct" should read --act--.

Line 60, "creating" should read --creation--.

COLUMN 7:

Line 42, "utes" should read --utes to said discharge.--.

Signed and Sealed this

Seventh Day of January, 1992

Attest:

HARRY F. MANBECK, JR.

Attesting Officer     Commissioner of Patents and Trademarks